United States Patent
Oyanagi

(10) Patent No.: US 7,455,730 B2
(45) Date of Patent: Nov. 25, 2008

(54) METHOD FOR GROWTH OF SILICON CARBIDE SINGLE CRYSTAL, SILICON CARBIDE SEED CRYSTAL, AND SILICON CARBIDE SINGLE CRYSTAL

(75) Inventor: Naoki Oyanagi, Chiba (JP)

(73) Assignee: Showa Denko K.K., Tokyo (JP)

(\*) Notice: Subject to any disclaimer, the term of this patent is extended or adjusted under 35 U.S.C. 154(b) by 227 days.

(21) Appl. No.: 10/560,745

(22) PCT Filed: Jun. 15, 2004

(86) PCT No.: PCT/JP2004/008681

§ 371 (c)(1),
(2), (4) Date: May 30, 2006

(87) PCT Pub. No.: WO2004/111318

PCT Pub. Date: Dec. 23, 2004

(65) Prior Publication Data

US 2007/0000432 A1    Jan. 4, 2007

Related U.S. Application Data

(60) Provisional application No. 60/483,022, filed on Jun. 27, 2003.

(30) Foreign Application Priority Data

Jun. 16, 2003  (JP) .............................. 2003-170539

(51) Int. Cl.
*C30B 25/12* (2006.01)

(52) U.S. Cl. .............................. 117/89; 117/84; 117/90

(58) Field of Classification Search ................... 117/84, 117/89, 90
See application file for complete search history.

(56) References Cited

U.S. PATENT DOCUMENTS

5,958,132 A    9/1999  Takahashi et al.

FOREIGN PATENT DOCUMENTS

| JP | 3-501118 A | 3/1991 |
|---|---|---|
| JP | 4-16597 A | 1/1992 |
| JP | 5-262599 A | 10/1993 |
| JP | 5-319998 A | 12/1993 |
| JP | 6-227886 A | 8/1994 |
| JP | 9-157092 A | 6/1997 |
| JP | 2001-72490 A | 3/2001 |
| JP | 2001-181095 A | 7/2001 |
| JP | 2002-284599 A | 10/2002 |
| JP | 2004-99340 A | 4/2004 |
| WO | WO 89/04055 A1 | 5/1989 |

*Primary Examiner*—Felisa C Hiteshew
(74) *Attorney, Agent, or Firm*—Sughrue Mion, PLLC

(57) ABSTRACT

A method for producing a single crystal includes supplying a vapor gas from silicon carbide as a raw material to a seed crystal formed of a silicon carbide single crystal to grow the seed crystal. The seed crystal is disposed in a part of crystal growth, with a crystal face of the seed crystal inclined relative to a (0001) plane or (000-1) plane, thereby making crystal growth.

4 Claims, 2 Drawing Sheets

(a)

300 μ

(b)

300 μ

METHOD FOR GROWTH OF SILICON CARBIDE SINGLE CRYSTAL, SILICON CARBIDE SEED CRYSTAL, AND SILICON CARBIDE SINGLE CRYSTAL

CROSS REFERENCE TO RELATED APPLICATIONS

This application is an application filed under 35 U.S.C. §111(a) claiming the benefit pursuant to 35 U.S.C. §119(e)(1) of the filing date of Provisional Application No. 60/483,022 filed Jun. 27, 2003 pursuant to 35 U.S.C. §111(b).

TECHNICAL FIELD

This invention relates to a method for crystal growth, particularly for the growth of high-quality single crystal in making crystal growth by the sublimation technique of a silicon carbide single crystal substrate to be used in optical devices and high pressure resistant, large-power semiconductor devices.

BACKGROUND ART

Silicon carbide is a material characterized by manifesting high thermal conductivity, generally excelling in heat resistance and mechanical strength, exhibiting physical and chemical stability evinced by strong durability to withstand radioactive rays, and enjoying a broad energy bandgap. Particularly, the 6H type silicon carbide crystal possesses a forbidden bandwidth of about 3 eV at room temperature and therefore secures adoption as a blue light-emitting diode. Thus, it can be utilized as materials for environmental resistance devices, radioactive ray resistance devices, electric power controlling devices and short-wavelength light-emitting devices that are usable at elevated temperatures.

As a means to produce the silicon carbide single crystal, the method of sublimation using silicon carbide powder as a raw material at an elevated temperature is generally used (International Unexamined Patent Publication HEI 3-501118, for example).

In the production of a silicon carbide single crystal by the method of sublimation, a crucible packed with silicon carbide powder as a raw material and having a seed crystal substrate mounted therein is decompressed in an atmosphere of an inert gas and the entire apparatus is heated to a temperature in the range of 1800 to 2400° C. The chemical seed (gas) generated by the decomposition and sublimation of the silicon carbide powder in consequence of the heating reaches the surface of the seed crystal substrate retained in the range of growth temperature and undergoes epitaxial growth as a seed crystal. Wafers of such seed crystal grown to the approximate level of 3 inches are now available on the market.

In consequence of the elevation of temperature, the silicon carbide as the raw material emits the vapors of Si, $Si_2C$, $SiC_2$, SiC, etc. which contribute to the growth of crystal and induces floatation in the crucible of fine particles of impurities and crystallinity-interfering fine particles which are entrained by the raw material as well. It is said that the adhesion of such fine particles of impurities to the surface of the single crystal growing from the seed crystal substrate disposed opposite the layer of silicon carbide raw material in the crucible forms the cause for generation of micro-pipes in the epitaxially growing single crystal and occurrence of dislocation of the crystal.

For the sake of manufacturing a single crystal of silicon carbide into a seed crystal substrate, it is subjected to formation working that comprises as grinding, washing and chemical treatment. The seed crystal substrate retains on the surface thereof disturbances, such as a degenerated layer induced during the course of the formation working. Since the denatured layer retained on the silicon carbide is chemically stable, it is not easily removed owing to the unavailability of a proper etchant. In the ordinary method of sublimation, therefore, the crystal defect in the surface of the seed crystal substrate forms the cause for frequent occurrence of crystal defects, such as micro-pipes and helical crystal dislocation. Further, the conventional method of sublimation has encountered difficulty in controlling the shape of crystal and the surface of crystal because it induces growth of a crystal by spontaneous formation of a nucleus.

The conventional method of sublimation has been unable to preclude occurrence of numerous kinds of crystal defects, such as micro-pipes, helical crystal dislocation and small inclination grain boundary in the grown single crystal owing to the improper selection of the crystal faces and the growth conditions. Thus, the silicon carbide wafers currently manufactured and marketed suffer the occurrence of numerous defects that result in imparting a degraded quality to the electric devices using substrates of silicon carbide.

In the case of a Si bulk crystal, for example, the problem of such intrinsic defects as exist in a seed crystal is solved through adoption of a procedure that comprises tentatively thinning the seed crystal by means of the so-called necking treatment, thereby reducing the defects, and then enlarging the diameter to consequently obtain a substrate of a large diameter. Also in the case of silicon carbide, for the purpose of removing the causes for crystal defects one by one, a concept of reducing defects by squeezing a given crystal tentatively to a thin diameter and then allowing it to grow has been proposed (JP-A HEI 5-319998, for example).

In the case of silicon carbide, however, this method cannot thoroughly reduce crystal defects and cannot preclude the persistence of dislocations and defects of the extents of $5 \times 10^4$ to $3 \times 10^5/cm^2$ even after the necking treatment. Further, a concept of reducing micro-pipes by deliberately mingling impurities in the single crystal in a ratio of $10^{19}/cm^2$ or more has been proposed (JP-A HEI 9-157092, for example). The impurities so mingled tend to form nuclei of crystalline polymorph different in crystal structure from the single crystal of silicon carbide and induce frequent incorporation of crystalline polymorph.

This invention, in attaining crystal growth using a seed crystal of a large diameter formed by the method of sublimation and entailing defects ascribable thereto, is aimed at developing a method for producing a high-quality silicon carbide single crystal by making the growth of crystal without inducing new defects during the course of crystal growth.

DISCLOSURE OF THE INVENTION

This invention provides a method for producing a single crystal, comprising supplying a vapor gas from silicon carbide as a raw material to a seed crystal formed of a silicon carbide single crystal to grow the seed crystal, wherein the seed crystal is disposed in a low-temperature region of a part of crystal growth, with a surface of the seed crystal inclined relative to a (0001) plane or (000-1) plane, thereby making the crystal growth.

This invention further provides a method for producing a single crystal, comprising supplying a vapor gas from silicon carbide as a raw material to a seed crystal formed of a silicon carbide single crystal to grow the seed crystal, wherein the seed crystal is disposed in a low-temperature region of a part of crystal growth, with a surface of the seed crystal inclined relative to a (0001) plane or (000-1) plane, thereby making the crystal growth at a crystal growth rate of 0.05 mm/hr or less during an initial stage of crystal growth and at a crystal growth rate of 1 mm/hr or less thereafter.

In each of the methods for the growth of the silicon carbide single crystal mentioned above, the crystal face of the seed crystal is inclined by 4 to 45° relative to the (0001) plane or (000-1) plane.

In each of the methods for the growth of the silicon carbide single crystal mentioned above, the seed crystal is a seed crystal comprising a silicon carbide single crystal cut, polished, then washed and subjected to sacrificial oxidation, and surface-treated by HF washing.

This invention further provides a silicon carbide seed crystal comprising a silicon carbide single crystal cut, polished, then subjected to washing treatment and surface-treated, and having a crystal face inclined relative to a (0001) plane or (000-1) plane.

In the silicon carbide seed crystal mentioned above, the crystal face is inclined by 4 to 45° relative to the (0001) plane or (000-1) plane.

This invention further provides a silicon carbide single crystal grown using a silicon carbide seed crystal having a crystal face inclined by 4 to 45° relative to a (0001) plane or (000-1) plane.

It is inferred that the crystal defects are caused to flow in the direction of growth and are consequently abated because the crystal face of the seed crystal is inclined by a given angle relative to the (0001) plane or (000-1) plane.

BRIEF DESCRIPTION OF THE DRAWING

FIG. 2(*b*) depicts the result of an etch pit observation of a crystal grown, with the (000-1) plane as the surface of crystal growth.

BEST MODE FOR CARRYING OUT THE INVENTION

Figure 1:
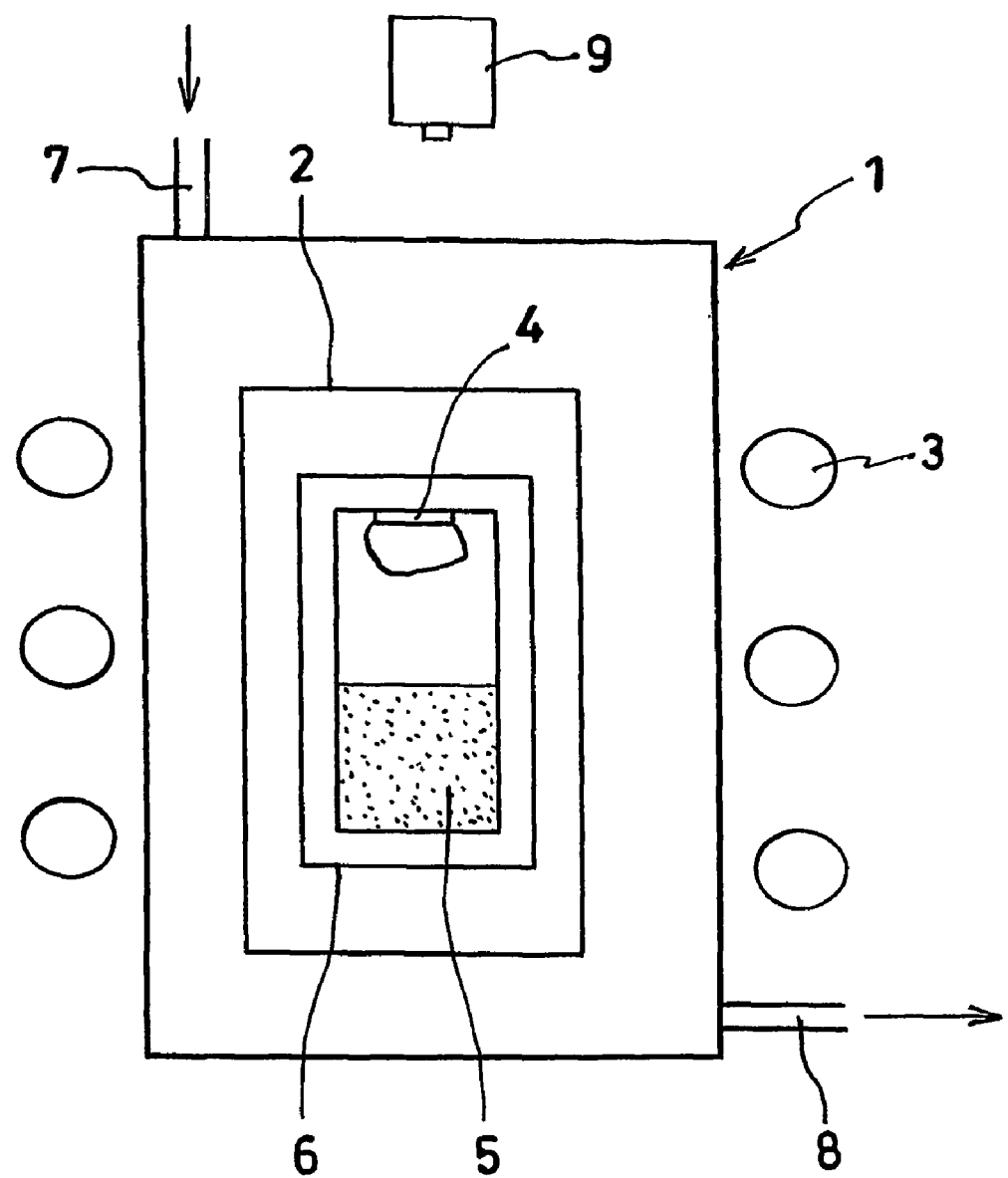
FIG. 1 is a cross section illustrating one example of an apparatus for crystal growth used for the growth of a silicon carbide single crystal of this invention.

One example of the apparatus of crystal growth for the growth of a silicon carbide single crystal of this invention is illustrated in FIG. 1. One preferred embodiment of this invention will be described below with reference to FIG. 1. In FIG. 1, reference numeral 1 denotes a vacuum vessel that is formed of a material that retains a high degree of vacuum, such as quartz or stainless steel. Inside this vacuum vessel 1, a graphite crucible 6 enclosed with a heat insulating material 2 is disposed. In the upper part of the crucible 6 that serves as a part for crystal growth, a silicon carbide seed crystal that is a seed crystal 4 is fixed. The graphite crucible and the heat insulating material are preferred to use a carbonaceous material that has undergone a refining treatment with a halogen gas. The lower part of the graphite crucible 6 possesses a largeness for storing a silicon carbide raw material 5 in an amount large enough for the growth of crystal. A high frequency heating coil 3 for heating the crucible 6 is rolled round the periphery of the crucible 6. The vacuum vessel 1 expels the air entrapped therein via a gas exhaust port 8 with the aid of a vacuum pump and admits argon gas via a gas input port 7 to retain the atmosphere of argon therein in a decompressed state. A radiation thermometer 9 is disposed above the vacuum vessel 1 to measure the temperature inside the crucible 6.

This invention makes the growth of a crystal of silicon carbide as follows using an apparatus for the production of a silicon carbide single crystal illustrated in FIG. 1. The silicon carbide single crystal is cut in a thickness of about 0.6 mm and polished so that the crystal face of a seed crystal may be inclined by 4 to 45° and preferably 7 to 30° from the (0001) plane or (000-1) plane of the silicon carbide single crystal. The surface of the seed crystal is preferred to undergo sacrificial oxidation, reactive ion etching or chemical machinery polishing as a final finish aimed at eliminating damage of polishing. As the silicon carbide single crystal, single crystals that are made by the Acheson process, Rayleigh's method and method of sublimation are available.

The angle of inclination mentioned above falls as a rule in the range of 4 to 45°. Particularly, when the seed crystal has a polymorphism of 6H, the angle is preferred to be 7° or more. When the polymorphism is 4H, the angle of 9° or more proves more effective. Though the cutting made in any direction produces a discernible effect, the direction <11-20>excels in reproducibility. The method for preparing the seed crystal comprises cutting and polishing a silicon carbide single crystal, for example, and washing the cut piece of crystal with sulfuric acid-hydrogen peroxide, ammonia-hydrogen peroxide and hydrochloric acid-hydrogen peroxide, respectively. The manufacture can be completed when having subsequently oxidized the surface at 1200° C. and washed it with hydrogen fluoride.

The seed crystal 4 that has undergone the surface treatment as described above is fixed mechanically or by a method of adhesion to the lid of the graphite crucible 6 in the crystal growth part. The graphite crucible 6 in which the silicon carbide raw material powder 5 is disposed opposite the seed crystal 4 is placed in the vacuum vessel 1 and evacuated of air with a turbo-molecular pump till $3 \times 10^{-5}$ Torr. Thereafter, the remaining gas is thoroughly displaced with Ar gas of high purity. Outside the graphite crucible 6, a high-frequency coil, for example, is disposed as the heating device 3 for heating the crucible. This heating device 3 is a means to heat the silicon carbide raw material powder 5 inside the graphite crucible 6 to a temperature of 2000° C. or more, for example, at which sublimation gas is generated.

Incidentally, the heating device does not need to be strictly limited to the high-frequency coil, but may be a device of the resistance heating type. Preferably, the crucible is covered with the heat insulating material 2 made of carbon fibers, for example, for the purpose of keeping the crucible at an elevated temperature. The position of the coil, for example, is adjusted so that the low-temperature crystal growth part holding the seed crystal will be heated to a temperature in the range of 1800 to 2300° C. and the high-temperature part holding the silicon carbide raw material to a higher temperature in the range of 2000 to 2400° C. than the temperature of the crystal growth part in an Ar atmosphere of 700 Torrs during the course of the heating. During the initial stage of growth, the growth is made at a rate of 0.05 mm/h or less, preferably 0.02 mm/h or less, to form a grown layer of a thickness in the range of 10 to 200 μm at that rate. Thereafter, the pressure is gradually decreased to 10 to 150 Torrs and the growth of crystal is made at a rate of 1 mm/h or less. During this course of growth, impurities, such as nitrogen and aluminum, may be added to the site of crystal growth.

When having caused the growth to proceed in a state having the temperature adjusted and the degree of super-saturation repressed, formation of nuclei is suppressed. It is inferred that the crystal defects are made to flow in the direction of growth and that the grown crystal is consequently enabled to enjoy reduced defects since an off angle is imparted to the seed crystal. Since the grown crystal has the axis of crystal kept inclined throughout the course of growth, it requires correction of angle when it is readied for cutting into wafers.

When the seed crystal so disposed as to have the crystal face inclined relative to the (0001) plane or (000-1) plane is grown, a silicon carbide crystal of high level of quality having crystal defects and density of dislocation of 5000/cm$^2$ or less is obtained because the formation of defects during the course of crystal growth owing to causes other than such inevitable causes due to defects of seed crystal can be repressed to an extremely low degree.

Now, Examples of this invention will be described below. It should be noted, however, that this invention is not limited to these Examples.

EXAMPLE 1

A seed crystal substrate (0.4 mm in thickness) formed of a 6H-silicon carbide single crystal about 1.5 cm$^2$ in surface area which had been cut as inclined by 7° relative to the (0001) plane was washed with a sulfuric acid-hydrogen peroxide mixed solution at 110° C. for 10 minutes, with a current of extra-pure water for 5 minutes, with ammonia-hydrogen peroxide mixed solution for 10 minutes, with a current of extra-pure water for 5 minutes, with a hydrochloric acid-hydrogen peroxide mixed solution for 10 minutes, with a current of extra-pure water for 5 minutes and further with an HF solution. Thereafter, the resultant seed crystal substrate was subjected to surface oxidation at 1200° C. and then given HF washing again to complete a seed crystal.

A crucible of graphite measuring 50 mm in inside diameter and 95 mm in depth was filled with a silicon carbide raw material powder (made by Showa Denko K.K. and sold under the product code of "#240") to a height of 60 mm. Then, the aforementioned seed crystal was pasted to the lower side of the lid of the graphite crucible.

The lid was set in the opening of the crucible. The whole graphite crucible was wrapped with the heat insulating material of carbon fibers and was set in a reaction vessel held inside a high-frequency heating furnace. The interior of the reaction vessel was decompressed to 5×10$^{-5}$ Torr by expelling the entrapped gas via the gas exhaust port 8, pressurized to normal pressure by introducing argon gas via an inert gas input port 7 and then decompressed to 5×10$^{-5}$ Torr by expelling the entrapped air from the reaction vessel via the gas exhaust port. Then, argon gas was again introduced via the inert gas inlet port till 700 Torrs and the graphite crucible was heated till the upper part thereof reached 2200° C. and the lower part reached a level in the range of 2250 to 2300° C. Thereafter, the gas was discharged via the gas exhaust port. With the argon atmosphere kept in a state decompressed to 79.9 kPa (600 Torrs), the growth of silicon carbide single crystal was performed for 20 hours. The growth of crystal was further continued with the atmosphere further decompressed to 5.33 kPa (40 Torrs). The rate of growth was 0.02 mm/h under 79.9 kPa (600 Torrs) and 0.1 mm/h under 5.33 kPa (40 Torrs).

Figure 2:
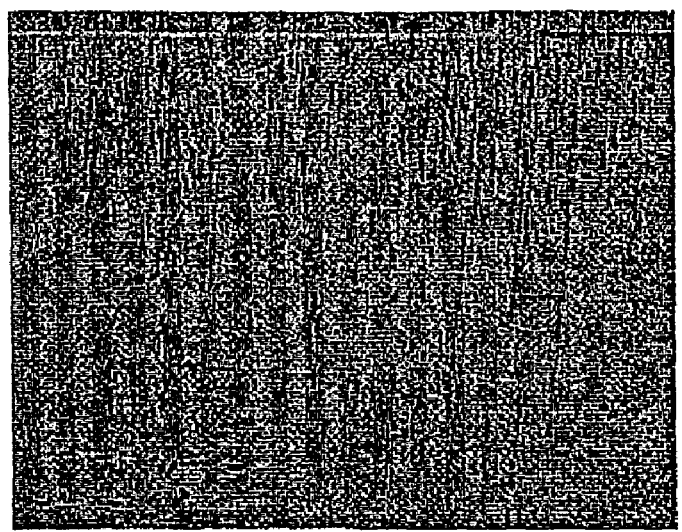
FIG. 2(*a*) depicts the result of an etch pit observation of a crystal grown from a seed crystal having the face thereof inclined by 7° relative to the (0001) plane.
Figure 2:
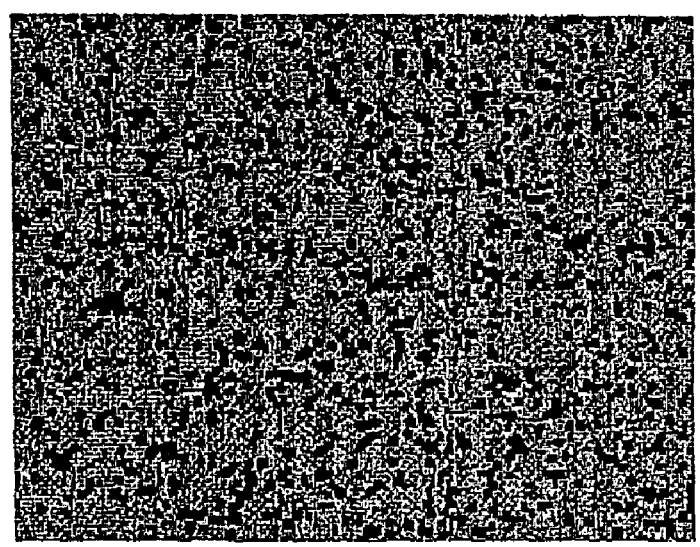

The crystal consequently obtained was cut perpendicularly to the direction of growth. The cut piece was polished to a specular surface, kept immersed in fused KOH of 500° C. for 10 minutes and subjected to etch pit observation. The result of this observation is illustrated in FIG. 2(*a*). The results showed an extremely small etch pit density.

For the purpose of comparison, crystal growth was performed following the procedure of Example 1 while changing the crystal growth face to the (0001) plane. The crystal consequently obtained was cut perpendicularly to the direction of growth. The cut piece was polished to a specular surface, kept immersed in fused KOH of 500° C. for 10 minutes and subjected to etch pit observation. The result of this observation is illustrated in FIG. 2(*b*). The density of etch pits was conspicuous and the crystal defects were really numerous as compared with those obtained on a crystal face inclined relative to the (0001) plane. This fact clearly indicates that the inclination of the crystal face results in repressing dislocation and small inclination grain boundary that occurs during the growth of crystal.

EXAMPLE 2

Crystal growth was carried out by following the procedure of Example 1 while using a 4H-silicon carbide crystal disposed as inclined by 10° relative to the (000-1) plane as a seed crystal and setting the temperature of the upper part of the crucible at 2150° C. and that of the lower part at 2200 to 2250° C.

Again in this case, a decrease in the density of etch pits was recognized as compared with the crystal obtained without inclining the crystal face. The grown crystal was devoid of a polytype. This fact clearly indicates that the inclination of the crystal face results in repressing dislocation and small inclination grain boundary that occurs during the growth of crystal.

INDUSTRIAL APPLICABILITY

In a method for producing a single crystal by supplying a vapor gas from a raw material silicon carbide at a high temperature of 2000° C. or more to a seed crystal formed of a silicon carbide single crystal, thereby inducing growth of the silicon carbide single crystal, the growth of the crystal disposed as inclined by a given angle relative to the (0001) plane or (000-1) plane results in repressing dislocation and small inclination grain boundary occurring during the growth of crystal and obtaining a silicon carbide crystal with reduced defects.

The invention claimed is:

1. A method for producing a single crystal from a seed crystal formed of a silicon carbide single crystal by growing the seed crystal, comprising:
   disposing the seed crystal in a part of a crucible where crystal growth occurs, with a crystal face of the seed crystal inclined relative by 4 to 45* relative to a (0001) plane or (000-1) plane,
   wherein the seed crystal is a seed crystal comprising a silicon carbide single crystal cut, polished, then washed and subjected to sacrificial oxidation, and surface-treated by HF washing, and
   supplying a vapor gas from silicon carbide as a raw material to the seed crystal formed of a silicon carbide single crystal to grow the seed crystal.

2. A method for producing a single crystal from a seed crystal fonned of a silicon carbide single crystal by growing the seed crystal, comprising:
   disposing the seed crystal in a low-temperature region of a crucible where crystal growth occurs, with a crystal face of the seed crystal inclined by 4 to 45° relative to a (0001) plane or (000-1) plane,
   supplying a vapor gas from silicon carbide as a raw material to the seed crystal formed of a silicon carbide single crystal to grow the seed crystal, and growing the seed crystal at a crystal growth rate of 0.05 mm/hr or less during an initial stage of crystal growth and at a crystal growth rate of 1 mm/hr or less thereafter.

3. A method for producing a single crystal from a seed crystal formed of a silicon carbide single crystal by growing the seed crystal, comprising:

disposing the seed crystal in a low-temperature region of a crucible where crystal growth occurs, with a crystal face of the seed crystal inclined relative to a (0001) plane or (000-1) plane, wherein the seed crystal is a seed crystal comprising a silicon carbide single crystal cut, polished, then washed and subjected to sacrificial oxidation, and surface-treated by HF washings, supplying a vapor gas from silicon carbide as a raw material to the seed crystal formed of a silicon carbide single crystal to grow the seed crystal, and growing the seed crystal at a crystal growth rate of 0.05 mm/hr or less during an initial stage of crystal growth and at a crystal growth rate of 1 mm/hr or less thereafter.

4. A method for producing a single crystal from a seed crystal formed of a silicon carbide single crystal by growing the seed crystal, comprising:

disposing the seed crystal in a low-temperature region of a crucible where crystal growth occurs, with a crystal face of the seed crystal inclined by 4 to 45° relative to a (0001) plane or (000-1) plane, wherein the seed crystal is a seed crystal comprising a silicon carbide single crystal cut, polished, then washed and subjected to sacrificial oxidation, and surface-treated by HF washing, supplying a vapor gas from silicon carbide as a raw material to the seed crystal formed of a silicon carbide single crystal to grow the seed crystal, and growing the seed crystal at a crystal growth rate of 0.05 mm/hr or less during an initial stage of crystal growth and at a crystal growth rate of 1 mm/hr or less thereafter.

* * * * *